United States Patent
Mohammadi

(10) Patent No.: US 7,202,749 B2
(45) Date of Patent: Apr. 10, 2007

(54) AC COUPLING TECHNIQUE FOR IMPROVED NOISE PERFORMANCE AND SIMPLE BIASING

(75) Inventor: Behnam Mohammadi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 121 days.

(21) Appl. No.: 11/035,883

(22) Filed: Jan. 18, 2005

(65) Prior Publication Data
US 2006/0066412 A1    Mar. 30, 2006

Related U.S. Application Data

(60) Provisional application No. 60/612,827, filed on Sep. 27, 2004.

(51) Int. Cl.
*H03F 3/14* (2006.01)
*H03F 1/52* (2006.01)

(52) U.S. Cl. ........ 330/307; 330/298
(58) Field of Classification Search ............. None
See application file for complete search history.

(56) References Cited

U.S. PATENT DOCUMENTS

| | | | | | |
|---|---|---|---|---|---|
| 3,986,133 | A | * | 10/1976 | Roza et al. | 330/306 |
| 4,039,964 | A | * | 8/1977 | Ishii | 330/267 |
| 4,321,428 | A | * | 3/1982 | Seki | 381/120 |
| 4,663,599 | A | * | 5/1987 | Patch | 330/311 |
| 5,740,000 | A | * | 4/1998 | Stackhouse et al. | 361/56 |
| 5,973,897 | A | * | 10/1999 | Opris et al. | 361/56 |
| 6,175,274 | B1 | * | 1/2001 | Groe | 330/51 |
| 6,636,118 | B1 | * | 10/2003 | Kusano et al. | 330/298 |
| 6,894,567 | B2 | * | 5/2005 | Vickram et al. | 330/298 |
| 7,035,616 | B2 | * | 4/2006 | Reynolds | 455/326 |

* cited by examiner

*Primary Examiner*—Robert Pascal
*Assistant Examiner*—Krista M. Flanagan
(74) *Attorney, Agent, or Firm*—Squire, Sanders & Dempsey L.L.P.

(57) ABSTRACT

A low noise amplifier (LNA), which utilizes an AC coupling technique that can internally bias diodes in such a way as to provide effective low noise amplification, is provided. The low noise amplifier includes an input to an amplifier circuit, and an AC coupling capacitor disposed externally to a chip boundary of the amplifier circuit.

13 Claims, 5 Drawing Sheets

AC COUPLING TECHNIQUE FOR IMPROVED NOISE PERFORMANCE AND SIMPLE BIASING

CROSS REFERENCE TO RELATED APPLICATIONS

This Application claims priority of U.S. Provisional Application Ser. No. 60/612,827, filed on Sep. 27, 2004. The subject matter of this earlier filed provisional application is hereby incorporated by reference.

BACKGROUND OF THE INVENTION

1. Field of the Invention

The invention is related to a low noise amplifier (LNA) which utilizes an AC coupling technique that can internally bias the electrostatic discharge (ESD) protection diodes in such a way as to provide effective low noise amplification. The invention can also be utilized in power amplifiers to eliminate the need for external biasing.

2. Description of the Related Art

An amplifier is a device or circuit which produces an electrical output that is a function of the corresponding input parameter while increasing the magnitude of the input signal by means of energy drawn from an external source. This process, however, invariably introduces some noise and distortion into the signal. Low noise amplifiers are a special type of amplifier used in communication systems to amplify very weak signals captured by an antenna.

Conventional low noise amplifiers traditionally use an on-chip AC coupling capacitor to couple an incoming radio frequency signal (RF) without affecting bias. On-chip AC coupling capacitors are known to be used between input ESD diodes and a bias resistor. AC coupling serves to remove the static DC components from the input signal to the amplifier, leaving only the components of the signal that varies with time. Conventional placement of the AC coupling capacitor biases the input at zero volts unless external biasing is used.

It is an object of the present invention to provide a low noise amplifier using an AC coupling technique which can internally bias diodes and provide effective low noise amplification. The present invention can reduce capacitance of the ESD diodes and improve the noise figure of the low noise amplifier. The present invention can also be used to eliminate the need for external biasing of the ESD diodes in power amplifiers.

SUMMARY OF THE INVENTION

In one embodiment of the present invention, a low noise amplifier is provided. The low noise amplifier includes an input to an amplifier circuit located on a chip. The amplifier further includes an AC coupling capacitor disposed externally to a boundary of the chip on which the amplifier circuit is located.

In another embodiment of the invention, a method of operating a low noise amplifier is provided. The method includes the steps of receiving an input to an amplifier circuit, and providing an AC coupling capacitor. The AC coupling capacitor is disposed externally to a chip boundary of the amplifier circuit.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

The present invention is related to a low noise amplifier (LNA) which utilizes an AC coupling technique which can internally bias the ESD protection diodes in such a way as to provide effective low noise amplification.

Figure 1:
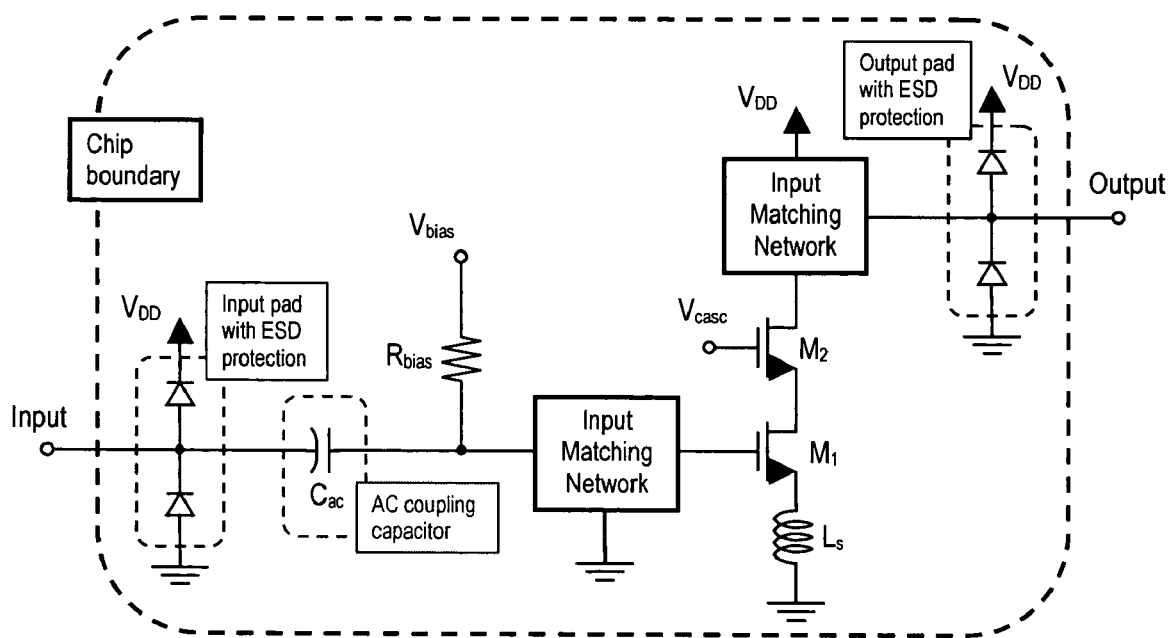
FIG. 1 illustrates a schematic diagram of a conventional low noise amplifier.

FIG. 1 illustrates a low noise amplifier which utilizes a conventional AC coupling technique. The amplifier circuit has an input thereto, and an on-chip AC coupling capacitor $C_{ac}$. According to this conventional configuration, the on-chip AC coupling capacitor $C_{ac}$ is placed between the input ESD diodes of the input pad and the bias resistor $R_{bias}$. The bias voltage $V_{bias}$ is applied to the input transistor $M_1$ through $R_{bias}$. In this example a low-pass input matching network is assumed. In the case that a high-pass input matching network is used, $R_{bias}$ must be placed after input matching network or possibly eliminated by applying $V_{bias}$ directly through the input matching network. The purpose of the AC coupling capacitor is to couple the incoming RF signal into the low noise amplifier without affecting the amplifiers bias. In this conventional architecture, the input pad is biased at zero volts unless it is externally biased. In the illustration of FIG. 1, the commonly used cascode inductive source degeneration architecture is shown where the degeneration inductor is used for simultaneous noise and power matching and the cascode device $M_2$, which is used for improved reversed isolation, is biased at $V_{casc}$. However, the following discussion also applies to other low noise amplifier architectures. The output matching network is placed at the drain of the $M_2$ followed by an ESD protected output pad. Output ESD protection is not required if the output of the LNA is applied to another on-chip component.

The AC coupling technique according to the present invention moves the AC coupling capacitor off-chip in order to internally bias the diodes at approximately midrail. This configuration can reduce capacitance of the ESD diodes, and can improve the noise figure of the low noise amplifier. The coupling technique of the invention can also be utilized for power amplifiers, since the invention can eliminate a requirement for external biasing of the ESD diodes. The present invention can improve the noise figure of low noise amplifiers, and can eliminate the need for off-chip biasing in power amplifiers.

Figure 2:
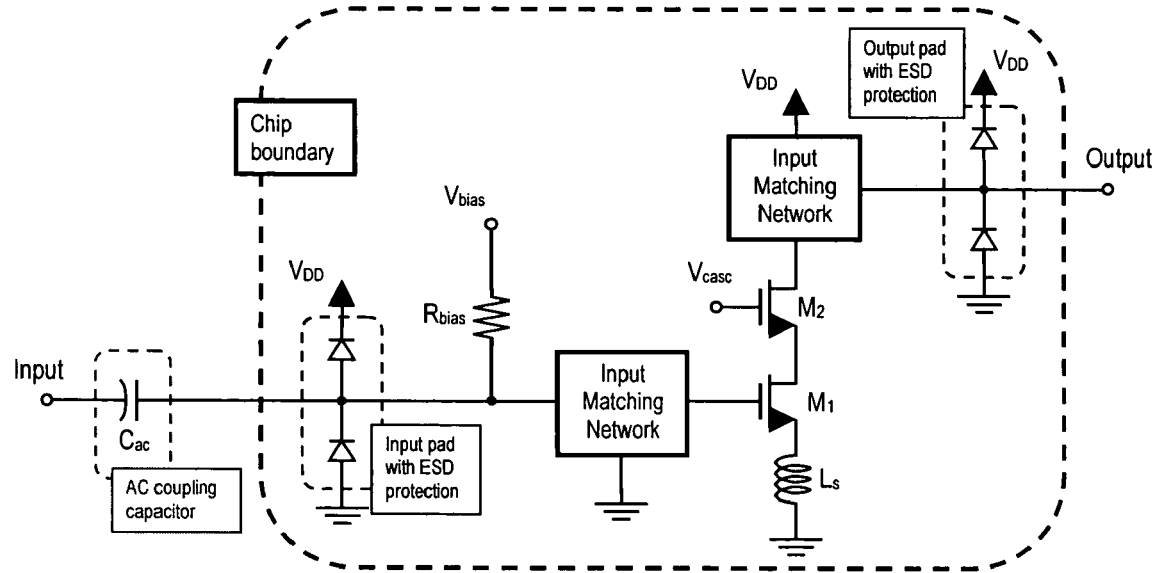
FIG. 2 illustrates a schematic diagram according to one embodiment of the present invention.

Referring, for example, to FIG. 2, an AC coupling capacitor is provided off-chip, as illustrated by capacitor $C_{ac}$ being placed outside of the chip boundary. Specifically, FIG. 2 illustrates an amplifier circuit according to one embodiment of the present invention. FIG. 2 shows an amplifier circuit having an input thereto, and a coupling capacitor $C_{ac}$ disposed external to the chip boundary and connected between the chip input and a power source. The device, according to this embodiment, may also include an input pad with ESD protection, with the input pad having one or more ESD diodes thereupon. A bias voltage $V_{bias}$ and a bias resistor $R_{bias}$ are provided downstream of the input pad, and input matching networks can also be provided downstream of the input pad. $V_{bias}$ may be applied to input transistor $M_1$ through $R_{bias}$. An output pad with ESD protection is also provided, with an output lead going from the output pad to a position outside of the chip boundary. Again, output ESD protection is not required if the output of the LNA is applied to another on-chip component.

Figure 3:
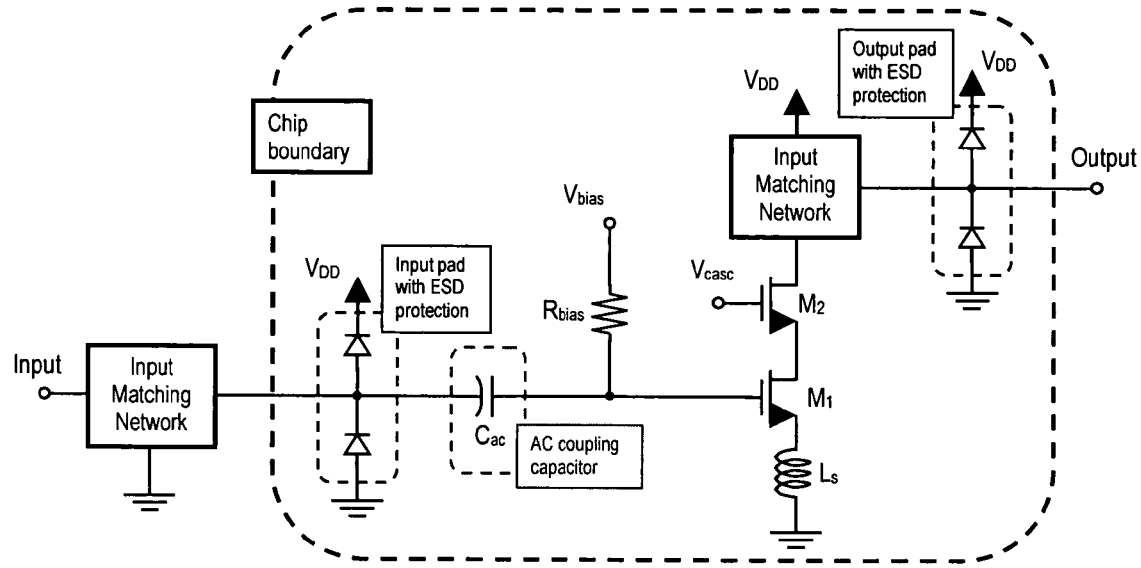
FIG. 3 illustrates a schematic diagram of another conventional low noise amplifier.

FIG. 3 illustrates another conventional configuration of a low noise amplifier utilizing an AC coupling technique. According to this conventional configuration, the input matching network is placed off-chip. The AC coupling capacitor $C_{ac}$, however, is placed on-chip between the input pad and the bias resistor $R_{bias}$. A bias voltage $V_{bias}$ is also provided downstream of the input pad, as well as additional input matching networks which also may be provided downstream. An output pad with ESD protection is also illustrated, with an output lead going from the output pad to a position outside of the chip boundary. The input pad is biased at 0 V.

Figure 4:
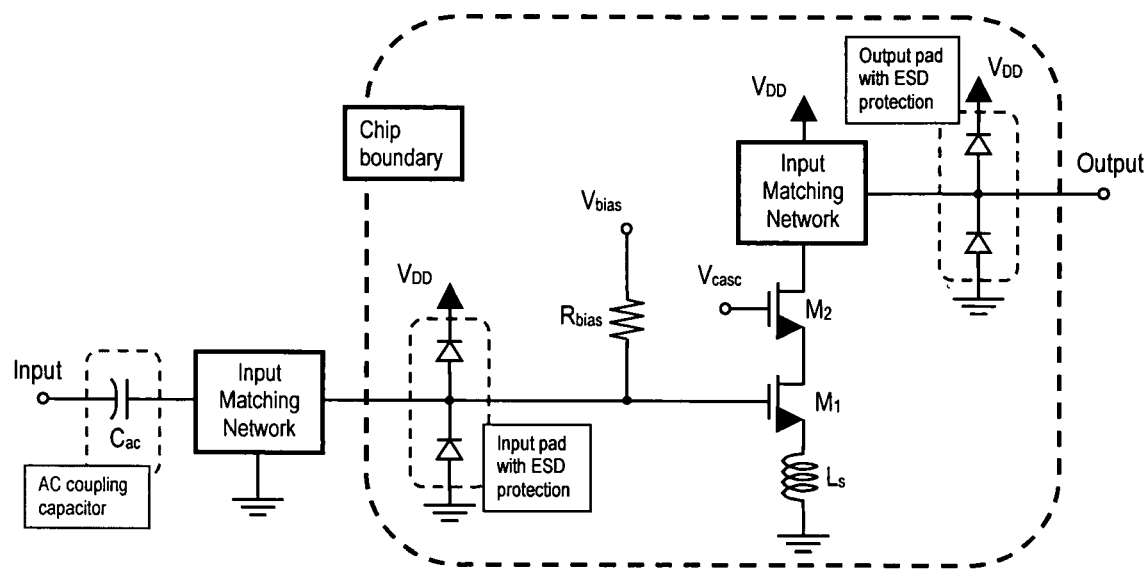
FIG. 4 illustrates a schematic diagram according to another embodiment of the present invention.

FIG. 4 illustrates an example of the AC coupling technique of the present invention where off-chip input matching is used. As in FIG. 2, the AC coupling capacitor $C_{ac}$ is moved off-chip and the input pad is internally biased at approximately midrail through the bias resistor $R_{bias}$ in order to improve the noise figure of the low noise amplifier.

It should be noted that in the above discussion, it was assumed that the input pad and its corresponding ESD diodes could not be separated. It is possible to apply the new AC coupling technique using an on-chip capacitor by separating the ESD diodes from the input pad and placing the on-chip AC coupling capacitor between the pad and the ESD diodes.

Figure 5:
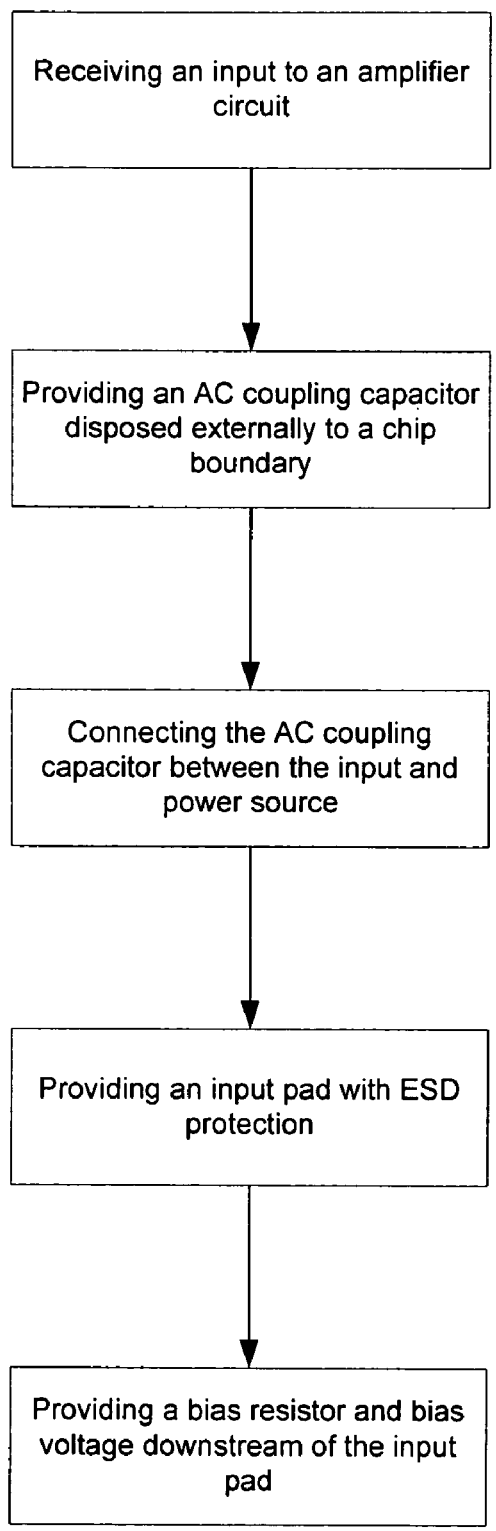
FIG. 5 illustrates a flow chart of a method according to one embodiment of the present invention.

FIG. 5 illustrates a method of operating a low noise amplifier according to an embodiment of the present invention. The method includes the steps of receiving an input to the amplifier circuit, and providing an AC coupling capacitor that is disposed externally to a chip boundary of said amplifier circuit. The method further includes the steps of connecting the AC coupling capacitor between said input and a power source, providing an input pad with ESD protection, providing a bias resistor downstream of the input pad, providing a bias voltage downstream of the input pad, providing at least one input matching network, and providing an output pad with ESD protection.

It should also be noted that the AC coupling technique of the present invention is suitable for Power Amplifiers since it eliminates the need for external biasing of the input pad at midrail. This is necessary since the large swing of the input signal can cause ESD diodes to turn on if the input pad is biased at 0 V.

As discussed above, the present invention provides a low noise amplifier using an AC coupling technique which can internally bias diodes and provide effective low noise amplification. The present invention can reduce capacitance of the ESD diodes and improve the noise figure of the low noise amplifier.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. A low noise amplifier, comprising:
    an input to an amplifier circuit, said amplifier circuit being located on a chip;
    an AC coupling capacitor disposed externally to the chip boundary of said amplifier circuit; and
    an input pad with electrostatic discharge (ESD) protection diodes,
    wherein a bias voltage is provided downstream of the input pad.

2. The low noise amplifier according to claim 1, wherein the AC coupling capacitor is connected between said input and a power source.

3. The low noise amplifier according to claim 1, wherein the input pad has at least one ESD diode thereupon.

4. The low noise amplifier according to claim 3, further comprising:
    a bias resistor provided downstream of the input pad.

5. The low noise amplifier according to claim 1, further comprising:
    at least one input matching network.

6. The low noise amplifier according to claim 5, wherein at least one of the at least one input matching networks is located off-chip.

7. The low noise amplifier according to claim 1, further comprising: an output pad with ESD protection.

8. A method of amplifying an input signal to a low noise amplifier, comprising the steps of:
    receiving an input signal to an amplifier circuit located on a chip; and
    providing an AC coupling capacitor between the input and a power source, wherein said AC coupling capacitor is disposed externally to the chip boundary of said amplifier circuit;
    providing an input pad with electrostatic discharge (ESD) protection diodes: and
    providing a bias voltage downstream of the input pad.

9. The method according to claim 8, wherein the input pad has at least one ESD diode thereupon.

10. The method according to claim 9, further comprising:
    providing a bias resistor downstream of the input pad.

11. The method according to claim 8, further comprising:
    providing at least one input matching network.

12. The method according to claim 8, further comprising: providing an output pad with ESD protection.

13. A low noise amplifier, comprising:
    receiving means for receiving an input to an amplifier circuit located on a chip; and
    providing means for providing an AC coupling capacitor, said AC coupling capacitor being disposed externally to the chip boundary of said amplifier circuit
    providing means for providing an input pad with electrostatic discharge (ESD) protection diodes; and
    providing means for providing a bias voltage downstream of the input pad.

* * * * *